(12) United States Patent
Lee

(10) Patent No.: US 7,180,346 B2
(45) Date of Patent: Feb. 20, 2007

(54) DUTY CYCLE CORRECTING CIRCUITS HAVING A VARIABLE GAIN AND METHODS OF OPERATING THE SAME

(75) Inventor: Jong-Soo Lee, Gyeonggi-do (KR)

(73) Assignee: Samsung Electronics Co. Ltd. (KR)

( * ) Notice: Subject to any disclaimer, the term of this patent is extended or adjusted under 35 U.S.C. 154(b) by 100 days.

(21) Appl. No.: 10/972,847

(22) Filed: Oct. 25, 2004

(65) Prior Publication Data
US 2005/0134341 A1  Jun. 23, 2005

(30) Foreign Application Priority Data
Dec. 23, 2003 (KR) .................. 10-2003-0095592

(51) Int. Cl.
*H03K 3/017* (2006.01)
(52) U.S. Cl. ..................... 327/175; 327/172
(58) Field of Classification Search ............... 327/172, 327/173, 174, 175, 291, 299
See application file for complete search history.

(56) References Cited

U.S. PATENT DOCUMENTS 5,642,068 A * 6/1997 Wojcicki et al. ........... 327/172
5,740,123 A * 4/1998 Uchida ...................... 365/233
5,757,218 A * 5/1998 Blum ......................... 327/175
6,081,142 A * 6/2000 Douchi et al. .............. 327/158
6,242,960 B1 * 6/2001 Bae ............................ 327/299
6,577,552 B2   6/2003 Merritt et al. ............. 365/226
6,643,790 B1 * 11/2003 Yu et al. ..................... 713/500
6,882,196 B2 * 4/2005 Yee et al. ................... 327/175

FOREIGN PATENT DOCUMENTS

KR         00026573      5/2000
KR       1020030025327    3/2003

* cited by examiner

Primary Examiner—Timothy P. Callahan
Assistant Examiner—Hai L. Nguyen
(74) Attorney, Agent, or Firm—Myers Bigel Sibley & Sajovec

(57) ABSTRACT

Duty cycle correcting circuits having a gain adjusting circuit that selects one of a plurality of gains of the duty cycle correcting circuit based on a frequency of an input signal. An output circuit outputs a duty cycle corrected output signal based on the input signal and the selected one of the plurality of gains. The input signal may be an input clock signal and the output signal may be a corrected clock signal. Methods are also provided.

25 Claims, 10 Drawing Sheets

DUTY CYCLE CORRECTING CIRCUITS HAVING A VARIABLE GAIN AND METHODS OF OPERATING THE SAME

CROSS-REFERENCE TO RELATED APPLICATION

This application claims the benefit of Korean Patent Application No. 2003-95592, filed Dec. 23, 2003, the disclosure of which is hereby incorporated herein by reference in its entirety.

BACKGROUND OF THE INVENTION

The present invention relates to integrated circuit devices and, more particularly, to duty cycle circuits and methods for integrated circuit devices.

It is know for various integrated circuit devices to utilize a duty cycle correcting circuit to adjust the duty cycle of an output clock signal on the integrated circuit device to fifty percent (50%). The duty cycle correcting circuit may include a duty cycle corrector and a duty cycle detector. As used herein, "duty cycle" refers to a ratio of a pulse width with respect to a pulse cycle of a clock signal.

FIG. 1 is a block diagram illustrating a conventional duty cycle correcting circuit. The duty cycle correcting circuit illustrated in FIG. 1 includes a duty cycle corrector 10, a duty cycle detector 12, and a signal transmission path portion 14. The duty cycle corrector 10 generates a corrected clock signal pair OUT and OUTB responsive to a voltage difference between an input clock signal pair ICLK and ICLKB and first and second duty detecting signals C and CB, which are output from the duty cycle detector. The duty cycle detector 12 detects a duty cycle of the output clock signal pair OCLK and OCLKB and generates the first and second detecting signals C and CB. The signal transmission path portion 14 receives the corrected clock signal pair OUT and OUTB to generate the output clock signal pair OCLK and OCLKB with a corrected duty cycle.

A gain of the conventional duty cycle correcting circuit is determined by multiplying a gain of the duty cycle corrector 10 by a gain of the duty cycle detector 12. A duty cycle correcting range of the duty cycle correcting circuit of FIG. 1 is directly proportional to the gain thereof and a jitter of a signal from the circuit is inversely proportional to the gain. In other words, when a gain of the duty cycle correcting circuit of FIG. 1 is large, a duty cycle correcting range thereof is increased and a jitter of a signal therefrom becomes larger based on a response characteristic and a signal to noise ratio (SNR) thereof. As the gain decreases, the duty cycle correcting range is reduced and the jitter becomes smaller based on the response characteristic and signal to noise ratio (SNR).

For the circuit of FIG. 1, when the frequency of the input clock signal is high, the desired duty cycle correcting range is generally decreased. On the other hand, when the frequency of the input clock signal is low, the desired duty cycle correcting range is generally increased. Thus, if a frequency of the input clock signal is a low frequency, an increased duty cycle correcting range is typically desired as contrasted with a high frequency input clock signal.

The conventional duty cycle correcting circuit of FIG. 1 may have a problem operating stably with a clock signal having a wide frequency range as its gain is typically fixed. In other words, if provided a high gain, a conventional circuit like that of FIG. 1 may have an increased duty cycle correcting range for stable operation when a low frequency clock signal is applied but, when a high frequency clock signal is applied, the circuit may become sensitive to noise and may not operate stably. In contrast, if provided a low gain, the circuit of FIG. 1 may be insensitive to noise and operate stably when a high frequency clock signal is applied but the circuit may have a reduced duty cycle correcting range. As a result, the circuit may not operate stably when a low frequency clock signal is applied.

SUMMARY OF THE INVENTION

Embodiments of the present invention provide duty cycle correcting circuits having a gain adjusting circuit that selects one of a plurality of gains of the duty cycle correcting circuit based on a frequency of an input signal. An output circuit outputs a duty cycle corrected output signal based on the input signal and the selected one of the plurality of gains. The input signal may be an input clock signal and the output signal may be a corrected clock signal.

In further embodiments of the present invention, the duty cycle correcting circuits include a frequency detecting circuit that detects a frequency of an input clock signal to generate a control signal and a duty cycle detecting circuit that detects a duty cycle of an output clock signal to generate first and second duty cycle detecting signals. The gain adjusting circuit and the output circuit provide a duty cycle corrector that selects one of the plurality of gains responsive to the control signal and generates the corrected clock signal responsive to the first and second duty cycle detecting signals. The control signal may be a predetermined number of signals.

In other embodiments of the present invention, the frequency detecting circuit includes a pulse generating circuit that detects a frequency of the input clock signal and generates a detecting signal based on the detected frequency of the input clock signal. A latch circuit latches the detecting signal from the pulse generating portion to provide a frequency detecting signal and a control signal generating circuit generates the control signals responsive to the frequency detecting signal. The pulse generating circuit may include a pulse generator that delays the input clock signal by a predetermined time period and generates a pulse signal responsive to an edge of the delayed input clock signal and a gate circuit that generates the detecting signal based on the input clock signal and the pulse signal. The control signal generating circuit may set at least one of the control signals to a logic "high" level responsive to the frequency detecting-signal from the latch circuit. The detecting signal may be a plurality of detecting signals, the frequency detecting signal may be a plurality of frequency detecting signals and the control signal generating circuit may set at least one of the control signals responsive to an edge of a frequency detecting signal. In further embodiments of the present invention, the control signal generating circuit includes a signal confirming portion that generates at least one frequency confirming signal maintained at a logic "high" level responsive to a selected at least one of the frequency detecting signals having a logic "high" level and another of the frequency detecting signals having a logic "low" level. In addition, a signal detecting portion sets a state of an upper frequency or a lower frequency one of the frequency confirming signals to a logic "high" level to generate the control signals when the at least one frequency confirming signal from the signal confirming portion is set to a logic "high" level.

In other embodiments of the present invention, the duty cycle correcting circuit reduces the gain responsive to the control signal when a frequency of the input clock signal is increased. The duty cycle correcting circuit may include a main amplifying portion that amplifies a voltage difference between the input clock signal and an inverted input clock signal and a sub amplifying portion that adjusts a gain responsive to the control signal and amplifies a voltage difference between the first and second duty cycle detecting signal. A common output signal of the main and sub amplifying portion may be generated as the corrected clock signal.

In further embodiments of the present invention, the duty cycle correcting circuit includes a first pulse signal generating portion that adjusts a delay time responsive to the control signal and the first duty cycle detecting signal and detects an edge of the input clock signal to generate a first pulse signal and a second pulse signal generating portion that adjusts a delay time responsive to the control signal and the second duty cycle detecting signal and detects an edge of the input clock signal to generate a second pulse signal. A latch portion combines the first pulse signal and the corrected clock signal to generate an inverted corrected clock signal and combines the second pulse signal and the inverted corrected clock signal to generate the corrected clock signal.

In other embodiments of the present invention, the gain adjusting circuit is configured to select a higher gain responsive to an increase in a number of the control signals having an active state and to select a lower gain responsive to a decrease in the number of the control signals having an active state. The frequency detecting circuit may be configured to detect at least a high frequency and a low frequency and the frequency detecting circuit may include a control signal generating circuit that sets a greater number of the control signals to the active state when a low frequency is detected than when a high frequency is detected. The control signals may include at least three control signals and the frequency detecting circuit may be configured to detect an intermediate frequency having a frequency between the high frequency and the low frequency and the control signal generating circuit may be configured to set a greater number of the control signals to the active state when an intermediate frequency is detected than when a high frequency is detected and a lesser number of the control signals to the active state when an intermediate frequency is detected than when a low frequency is detected. The active state may be a logic "high" level.

In further embodiments of the present invention, the output circuit of the duty cycle corrector includes a fixed gain amplifier circuit responsive to the input clock signal and having an output coupled to a signal line associated with the corrected clock signal and a variable gain amplifier responsive to a duty cycle detecting signal corresponding to a duty cycle of the duty cycle corrected output signal and the gain adjusting circuit and having an output coupled to the signal line associated with the corrected clock signal. The output circuit of the duty cycle corrector may, alternatively, include a pulse generator having a variable delay adjusting circuit that outputs a pulse signal responsive to the input clock signal, wherein the variable delay circuit has a delay selected by the gain adjusting circuit.

In other embodiments of the present invention, duty cycle correcting methods are provided including detecting a frequency of an input signal to a duty correcting circuit. A gain of the duty correcting circuit is adjusted based on the detected frequency. A duty cycle of an output signal of the duty correcting circuit is corrected with the gain adjusted duty correcting circuit. The input signal may be an input clock signal.

In further embodiments of the present invention, duty cycle correcting methods include detecting a duty cycle of an output clock signal to generate first and second duty cycle detecting signals. Detecting a frequency may include generating control signals based on the detected frequency. The gain may be adjusted responsive to the control signals. A corrected clock signal may be generated responsive to the first and second duty cycle detecting signals. The control signals may include a predetermined number of signals.

In other embodiments of the present invention, detecting a frequency includes detecting a frequency of the input clock signal to generate a detecting signal corresponding to the frequency of the input clock signal A detecting signal is latched to generate a corresponding frequency detecting signal and the control signals are generated responsive to the corresponding frequency detecting signal. Detecting a frequency of the input clock signal to generate a detecting signal may include delaying the input clock signal by a predetermined time period and detecting an edge of the input clock signal to generate a corresponding pulse signal and combining the input clock signal and the corresponding pulse signal to generate the corresponding detecting signal.

In further embodiments of the present invention generating control signals includes generating control signals such that a state of upper and/or lower frequency detecting signals of the corresponding frequency detecting signal is changed to generate the control signal when a state of the corresponding frequency detecting signal is changed. Generating control signals may include maintaining the corresponding frequency detecting signal at a logic "high" level to provide a corresponding frequency confirming signal when the corresponding frequency detecting signal has a logic "high" level, and an upper and/or lower frequency detecting signal of the corresponding frequency detecting signal has a logic "low" level and changing a state of an upper and/or lower corresponding frequency confirming signal of the corresponding frequency confirming signal to a logic "high" level to generate the control signals when the corresponding frequency confirming signal is changed to a logic "high" level.

In other embodiments of the present invention, correcting a duty cycle includes reducing the gain responsive to the control signal when a frequency of the input clock signal is increased. Correcting a duty cycle may include amplifying a voltage difference between the input clock signal and an inverted input clock signal to provide an output to a common output signal line and adjusting a gain may include adjusting a gain responsive to the control signal and amplifying a voltage difference between the first and second duty cycle detecting signal to provide an output to the common output signal line. The common output signal line may be the corrected clock signal. Correcting the duty cycle may include generating a first pulse signal by adjusting a delay time in response to the control signal and the first duty cycle detecting signal and detecting an edge of the input clock signal and generating a second pulse signal by adjusting a delay time in response to the control signal and the second duty cycle detecting signal and detecting an edge of the input clock signal. The first pulse signal and the corrected clock signal may be combined to generate an inverted corrected clock signal and receiving the second pulse signal and the inverted corrected clock signal to generate the corrected clock signal.

In further embodiments of the present invention, adjusting a gain includes selecting a higher gain responsive to an increase in a number of the control signals having an active state and to select a lower gain responsive to a decrease in the number of the control signals having an active state. Detecting a frequency may include detecting at least a high frequency and a low frequency and may further include setting a greater number of the control signals to the active state when a low frequency is detected than when a high frequency is detected.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION OF THE INVENTION

Figure 1:
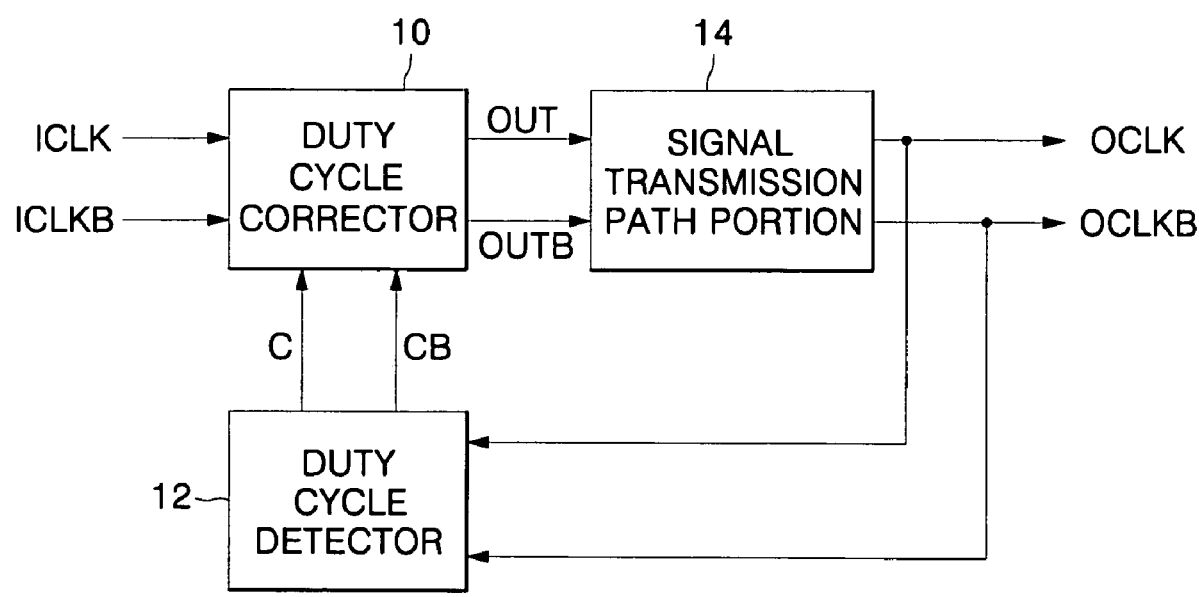
FIG. 1 is a block diagram illustrating a conventional duty cycle correcting circuit.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
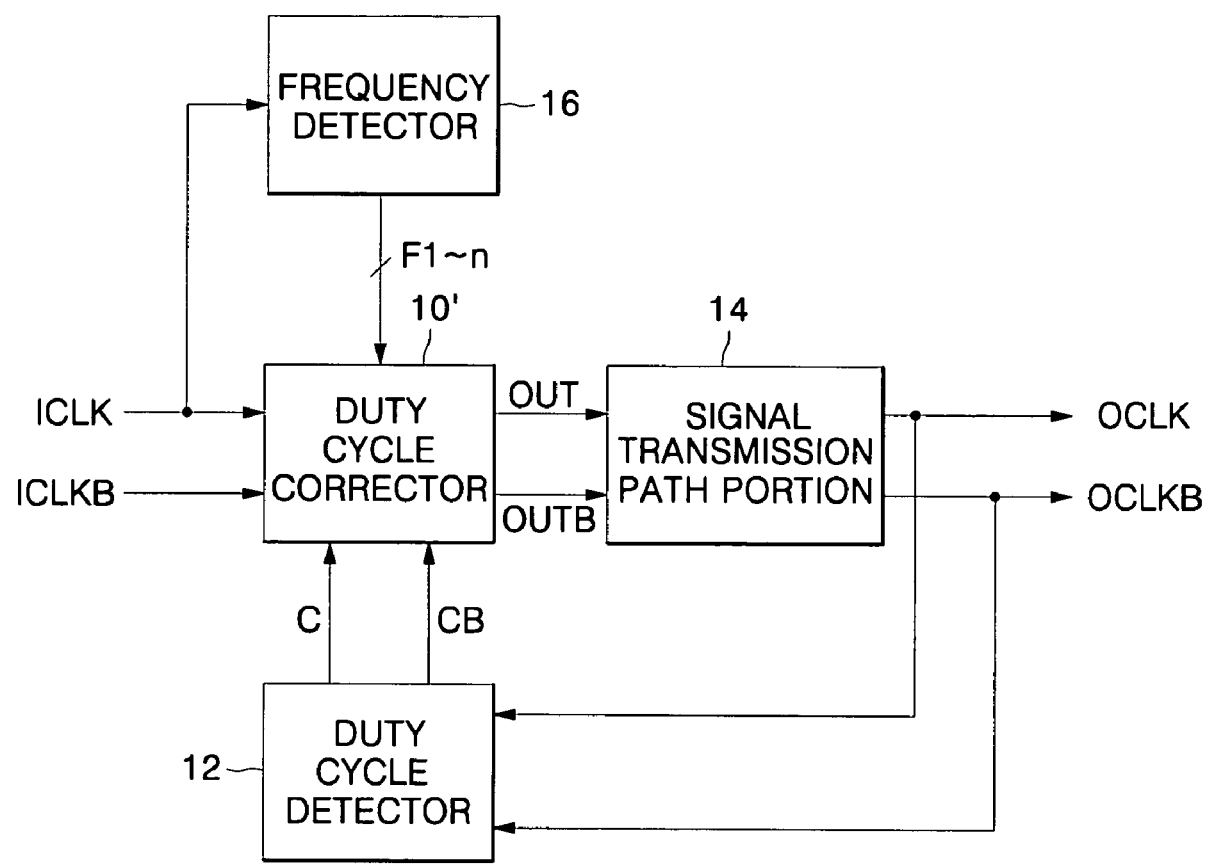
FIG. 2 is a block diagram illustrating a duty cycle correcting circuit according to some embodiments of the present invention.

Embodiments of the present invention will now be described with reference to FIGS. 2–8C. FIG. 2 is a block diagram illustrating a duty cycle correcting circuit according to some embodiments of the present invention. The duty cycle correcting circuit of the embodiments of FIG. 2 differs from the configuration of FIG. 1 in that FIG. 2 includes a duty cycle corrector 10' and a frequency detector 16. Common aspects between the circuits of FIGS. 1 and 2 are denoted by common numbers and description of aspects of operations in common between the two circuits will not be further described herein.

The duty cycle corrector 10' for the embodiments of FIG. 2 adjusts a gain in response to control signals F1 to Fn from a frequency detector 16 and corrects a duty cycle of a clock signal pair OUT and OUTB responsive to a voltage difference of first and second duty cycle detecting signals C and CB from the duty cycle detector 12. The frequency detector 16 detects a frequency of the input clock ICLK and generates control signals F1 to Fn that reduce a gain of the duty cycle corrector 10' when a frequency of the input clock signal ICLK is high and increase the gain of the duty cycle corrector 10' when the frequency of the input clock signal ICLK is low. In other words, the duty cycle correcting circuit of the embodiments of FIG. 2 reduces the gain of the duty cycle corrector 10' for a high frequency input clock signal ICLK and increases the gain of the duty cycle corrector 10' for a low frequency input clock signal ICLK.

Figure 3:
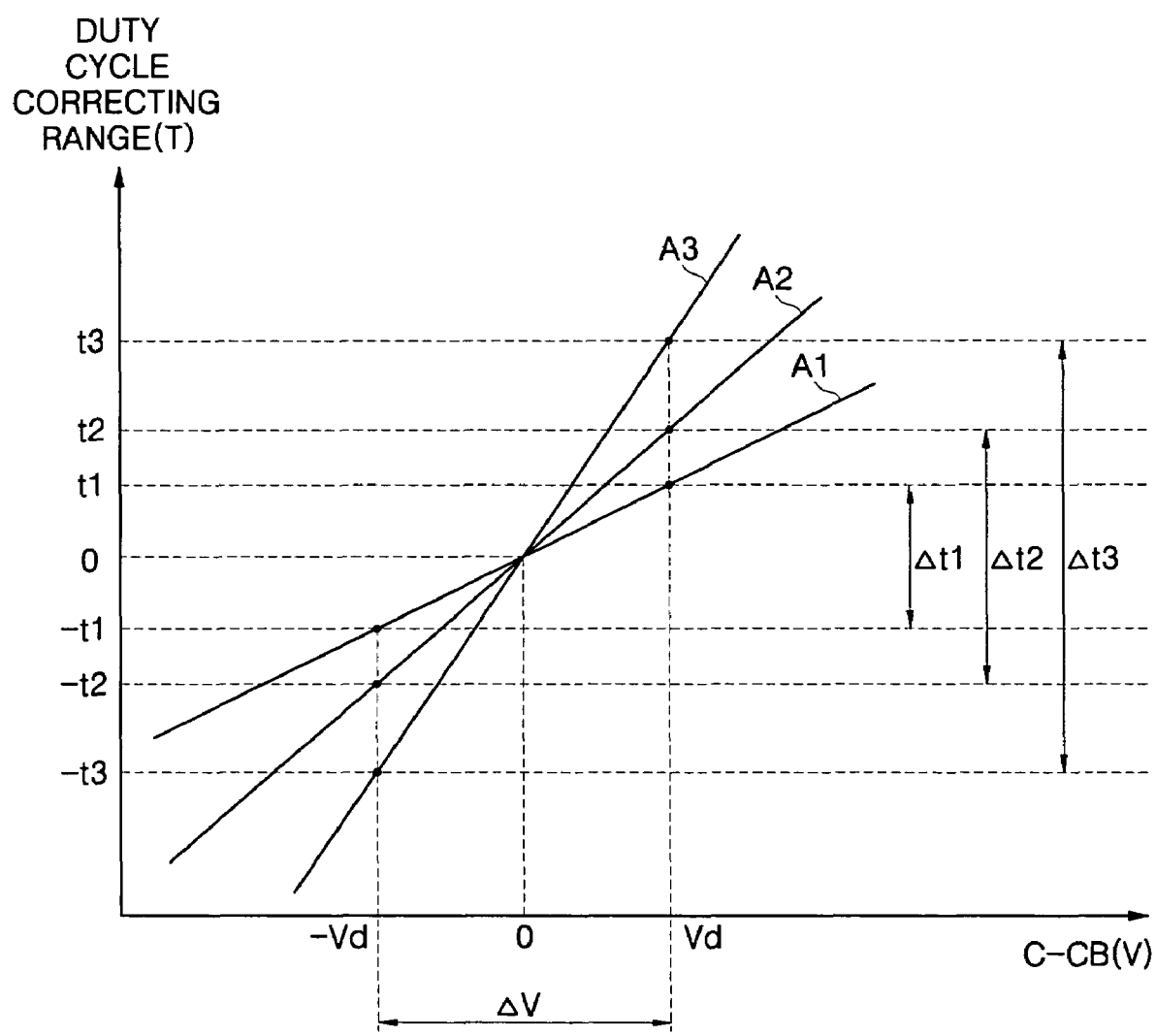
FIG. 3 is a graph illustrating a variable gain of a duty cycle corrector for some embodiments of the present invention.

FIG. 3 is a graph illustrating a variable gain of the duty cycle corrector of some embodiments of the present invention. The horizontal axis in FIG. 3 denotes a voltage V corresponding to a voltage difference between the first and second duty cycle detecting signals C, CB and the vertical axis denotes to a time T corresponding to a duty cycle correcting range.

As seen in FIG. 3, when a voltage difference (C-CB) between the first and second duty cycle detecting signals C and CB varies from a voltage −Vd to a voltage Vd, and when the duty cycle detector 10' has a gain illustrated by graph A3, a duty cycle correcting range varies from a time −t3 to a time t3. When the duty cycle detector 10' has a lower gain as illustrated by graph A2, the duty cycle correcting range varies from a time −t2 to a time t2. When the duty cycle detector 10' has an even lower gain as illustrated by graph A1, the duty cycle correcting range varies from a time −t1 to a time t1.

In other words, when a voltage difference between the first and second duty cycle detecting signals C and CB varies by a voltage ΔV, a duty cycle correcting range is: Δt1 with respect to a gain of the graph A1, Δt2 with respect to a gain of the graph A2, and Δt3 with respect to a gain of the graph A3. Thus, larger gain provides a wider duty cycle correcting range.

Figure 4:
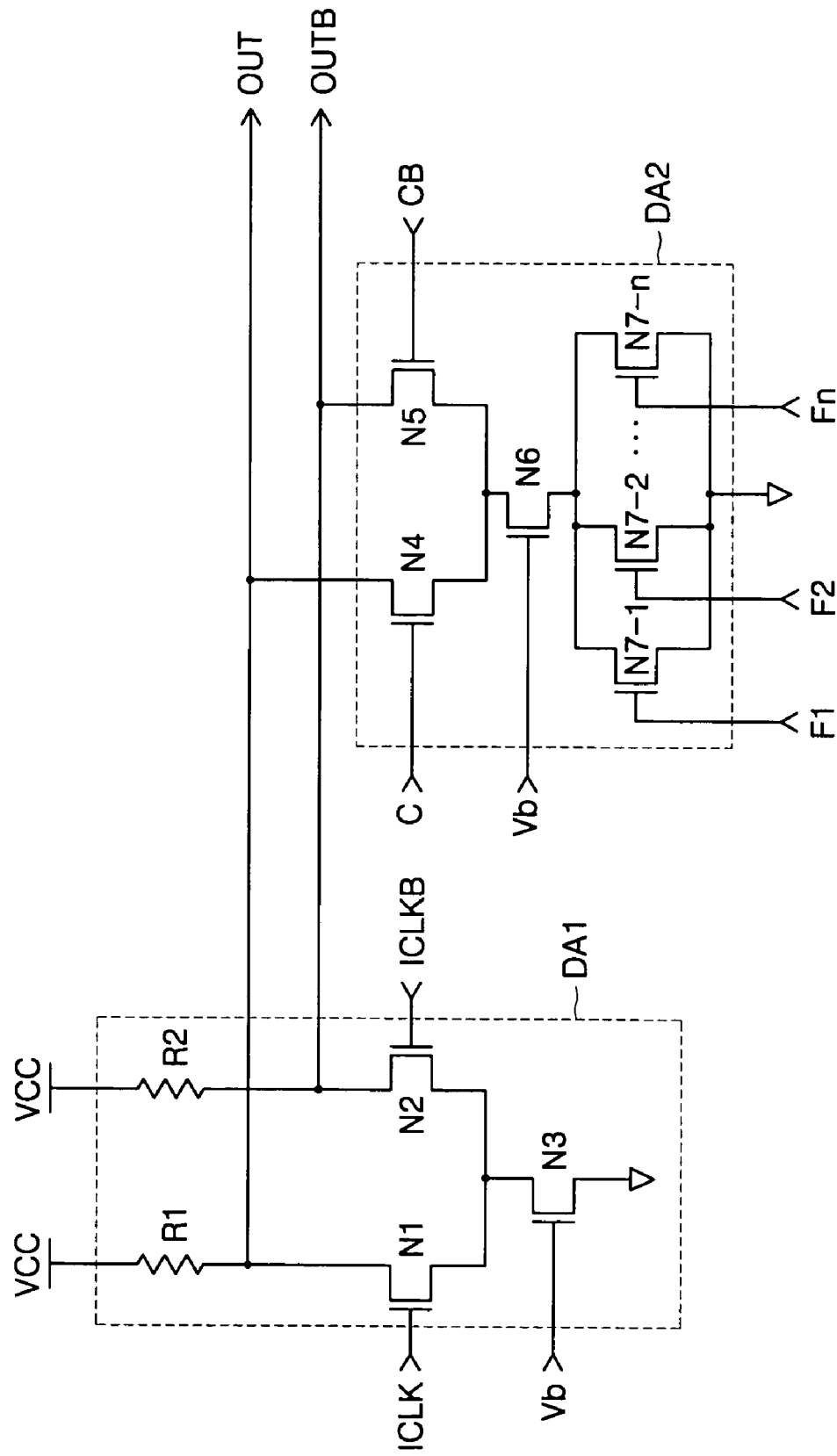
FIG. 4 is a circuit diagram illustrating a duty cycle corrector of a duty cycle correcting circuit according to some embodiments of the present invention.

FIG. 4 is a circuit diagram illustrating the duty cycle corrector of a duty cycle correcting circuit according to some embodiments of the present invention. The duty cycle corrector of FIG. 4 includes a main differential amplifier DA1 and a sub differential amplifier DA2. The main differential amplifier DA1 includes resistors R1 and R2 and NMOS transistors N1 to N3. The sub differential amplifier DA2 includes NMOS transistors N4 to N6 and N7-1 to N7-n.

The main differential amplifier DA1 is configured to amplify a voltage difference between the input clock signal pair ICLK and ICLKB when a bias voltage Vb is applied thereto. The sub differential amplifier DA2 adjusts a gain and amplifies a voltage difference between the first and second duty cycle detecting signals C and CB responsive to the control signals F1 to Fn to cause the main and sub differential amplifiers DA1 and DA2 to generate the corrected clock signal pair OUT and OUTB. As such the differential amplifier circuit DA1 in combination with the transistors N4, N5, N6 provide an output circuit that outputs a duty cycle corrected output signal based on the input signal ICLK, ICLKB and a selected one of a plurality of gains that may be provided by the gain adjusting circuit provided by the transistors N7-1 to N7-n.

When first and second duty cycle detecting signals C and CB having the same voltage difference are input, operation of the sub differential amplifier for various combinations of the control signals F1 to Fn will now be further explained. For some embodiments of the present invention, when all the control signals F1 to Fn have a logic "high" level, all the NMOS transistors N7-1 to N7-n are turned on to increase a driving current of the sub differential amplifier DA2, which provides a maximum gain of the sub differential amplifier DA2. As such, a duty cycle correcting range for a voltage difference of the first and second duty cycle detecting signals C and CB is maximized. When only one of the control signals F1 to Fn has a logic "high" level, only one of the NMOS transistors N7-1 to N7-n is turned on, resulting in a decreased driving current of the sub differential amplifier DA2 and the gain of the sub differential amplifier DA2 reaches an operational minimum (excluding a no logic "high" level control signal case where DA2 is ineffective).

As such, a duty cycle correcting range for a voltage difference of the first and second duty cycle detecting signals C and CB is minimized. In other words, a gain variation of the sub differential amplifier DA2 provides a gain variation of the duty cycle corrector 10', with a duty cycle correcting range increased when a gain of the duty cycle corrector 10' is increased and decreased when a gain of the duty cycle corrector 10' is decreased to provide the characteristics illustrated in the graph of FIG. 3.

Figure 5:
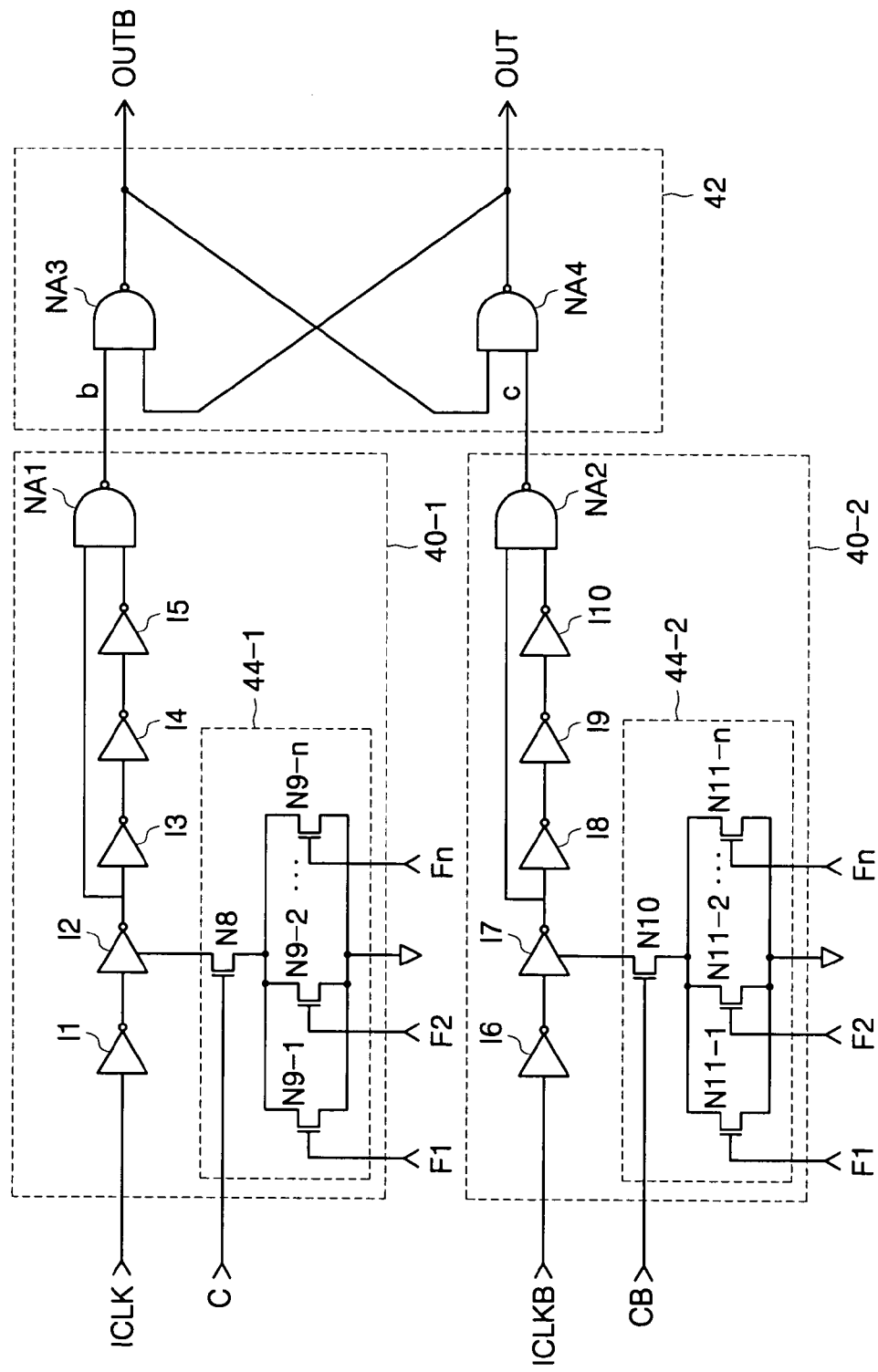
FIG. 5 is a circuit diagram illustrating a duty cycle corrector according further embodiments of the present invention.

FIG. 5 is a circuit diagram illustrating a duty cycle corrector according to other embodiments of the present invention. The duty cycle corrector of the embodiments of FIG. 5 includes pulse generators 40-1 and 40-2 and a latch 42. The pulse generator 40-1 includes inverters I1 to I5, a NAND gate NA1 and a first delay time adjusting circuit 44-1. The pulse generator 40-2 includes inverters I6 to I10, a NAND gate NA2 and a second delay time adjusting circuit 44-2. The first delay time adjusting circuit 44-1 includes NMOS transistors N8 and N9-1 to N9-n and the second delay time adjusting circuit 44-2 includes NMOS transistors N10 and N11-1 to N11-n. The latch 42 includes NAND gates NA3 and NA4. The delay time adjusting circuits 44-1, 44-2 provide a gain adjusting circuit that selects one of a plurality of gains and provides the selected gain to an output circuit defined by the other components illustrated in FIG. 5 that output a duty cycle corrected output signal based on the input signal ICLK, ICLKB and the selected one of a plurality of gains.

Operation of the duty cycle corrector of FIG. 5 will now be described. The pulse generator 40-1 detects a rising edge of the input clock signal ICLK to generate a pulse signal b having a pulse width corresponding to a delay time of the inverters I3 to I5. The pulse generator 40-2 detects a rising edge of the inverted input clock signal ICLKB to generate a pulse signal c having a pulse width corresponding to a delay time of the inverters I8 to I10. The pulse generator 40-1 controls a generation time point of the pulse signal b responsive to the first duty cycle detecting signal C and the control signals F1 to Fn. The pulse generator 40-2 controls a generation time point of the pulse signal c responsive to the second duty cycle detecting signal CB and the control signals F1 to Fn. The latch 42 corrects a duty cycle by setting the corrected clock signal OUTB to a logic "low" level when both the pulse signal b and the corrected clock signal OUT have a logic "high" level and setting the corrected clock signal OUTB to a logic "low" level when both the pulse signal c and the corrected clock signal OUTB have a logic "high" level.

Operation of the pulse generators 40-1 and 40-2 for various combinations of the control signals F1 to Fn will now be explained for some embodiments of the present invention as shown in FIG. 5. When all the control signals F1 to Fn have a logic "high" level, all the NMOS transistors N9-1 to N-n and N11-1 to N11-n are turned on to maximize a delay time of the delay adjusting circuits 44-1 and 44-2 so that a generation time point of the pulse signals b and c generated from the pulse generators 40-1 and 40-2 has a maximum delay. As a result, a duty cycle correcting range responsive to a voltage difference of the first and second duty cycle detecting signals C and CB is maximized. When only one of the control signals F1 to Fn has a logic "high" level, only one of the NMOS transistors N9-1 to N-n and one of the NMOS transistors N11-1 to N11-n are turned on to minimize a delay time of the delay adjusting circuits 44-1 and 44-2 so that a generation time point of the pulse signals b and c generated from the pulse generators 40-1 and 40-2 has a minimum delay. As a result, a duty cycle correcting range responsive to a voltage difference of the first and second duty cycle detecting signals C and CB is minimized. Thus, the embodiments of a duty cycle corrector of the present invention including the circuit of FIG. 5 varies a delay time (i.e., gain) in response to the control signals F1 to Fn to control a duty cycle correcting range.

Figure 6:
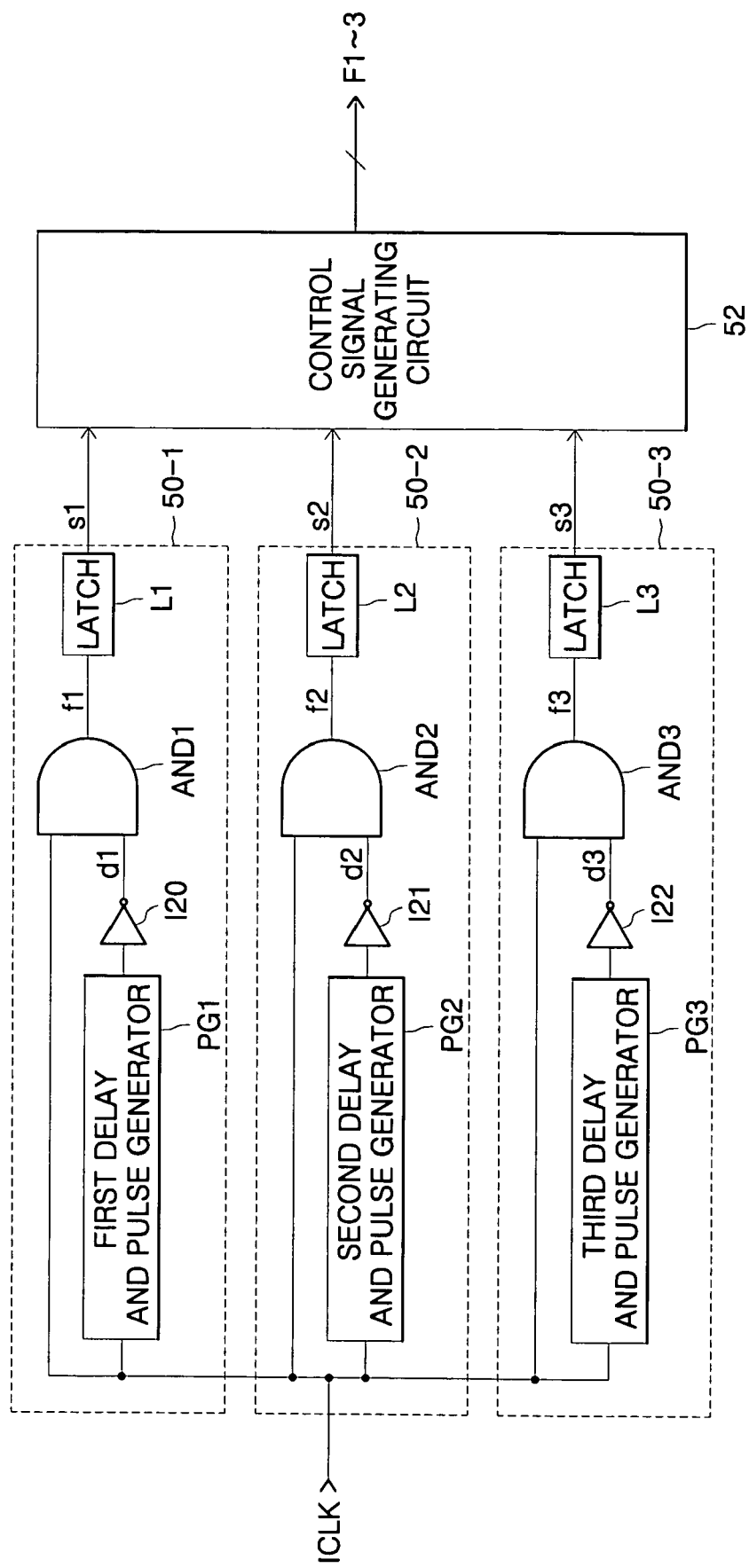
FIG. 6 is a circuit diagram illustrating a frequency detector of a duty cycle correcting circuit according to some embodiments of the present invention.

FIG. 6 is a circuit diagram illustrating a frequency detector of a duty cycle correcting circuit according to some embodiments of the present invention. The frequency detector of FIG. 6 includes a high frequency clock signal detecting circuit 50-1, an intermediate frequency clock signal detecting circuit 50-2, a low frequency clock signal detecting circuit 50-3 and a control signal generating circuit 52. The high frequency clock signal detecting circuit 50-1 includes a first delay and pulse generator PG1, an inverter I20, an AND gate AND1 and a latch L1. The intermediate frequency clock signal detecting circuit 50-2 includes a second delay and time pulse generator PG2, an inverter I21, an AND gate AND2 and a latch L2. The low frequency clock signal detecting circuit 50-3 includes a third delay and pulse generator PG3, an inverter I22, an AND gate AND3 and a latch L3.

Operation of the frequency detector circuit embodiments of FIG. 6 will now be further described. The first delay and pulse generator PG1 and the inverter I20 delay the input clock signal ICLK by a first delay time td1, detect an edge of the input clock signal ICLK to generate a pulse signal having a predetermined pulse width and invert the pulse signal to generate a first pulse signal d1. The second delay and pulse generator PG2 and the inverter I21 delay the input clock signal ICLK by a second delay time td2, detect an edge of the input clock signal ICLK to generate a pulse signal having a predetermined pulse width and invert the pulse signal to generate a second pulse signal d2. The third delay and pulse generator PG3 and the inverter I22 delay the input clock signal ICLK by a third delay time td3, detect an edge of the input clock signal ICLK to generate a pulse signal having a predetermined pulse width and invert the pulse signal to generate a third pulse signal d3.

The first to third delay times td1 to td3 may be set to desired values. The AND gate AND1 ANDs the input clock signal ICLK and the first pulse signal d1 to generate a first detecting signal f1. The AND gate AND2 ANDs the input clock signal ICLK and the second pulse signal d2 to generate a second detecting signal f2. The AND gate AND3 ANDs the input clock signal ICLK and the third pulse signal d3 to generate a third detecting signal f3. The latch L1 generates a high frequency detecting signal s1 having a logic "high" level in response to the first detecting signal f1 having a logic "high" level. The latch L2 generates an intermediate frequency detecting signal s2 having a logic "high" level in response to the second detecting signal f2 having a logic "high" level. The latch L3 generates a low frequency detecting signal s3 having a logic "high" level in response to the third detecting signal f3 having a logic "high" level. The control signal generating circuit 52 generates control signals F1 to F3 responsive to the detecting signals s1 to s3.

As such, the frequency detector of the embodiments of FIG. 6 generates a high frequency detecting signal s1 having a logic "high" level when a high frequency input clock signal ICLK is input, generates an intermediate frequency detecting signal s2 having a logic "high" level when an intermediate frequency input clock signal ICLK is input and generates a low frequency detecting signal s3 having a logic "high" level when a low frequency clock signal ICLK is input. The control signal generating circuit 52 receives the signals s1 to s3 and generates the control signals F1 to F3 that may be used to control a gain of the duty cycle corrector 10'.

Figure 7:
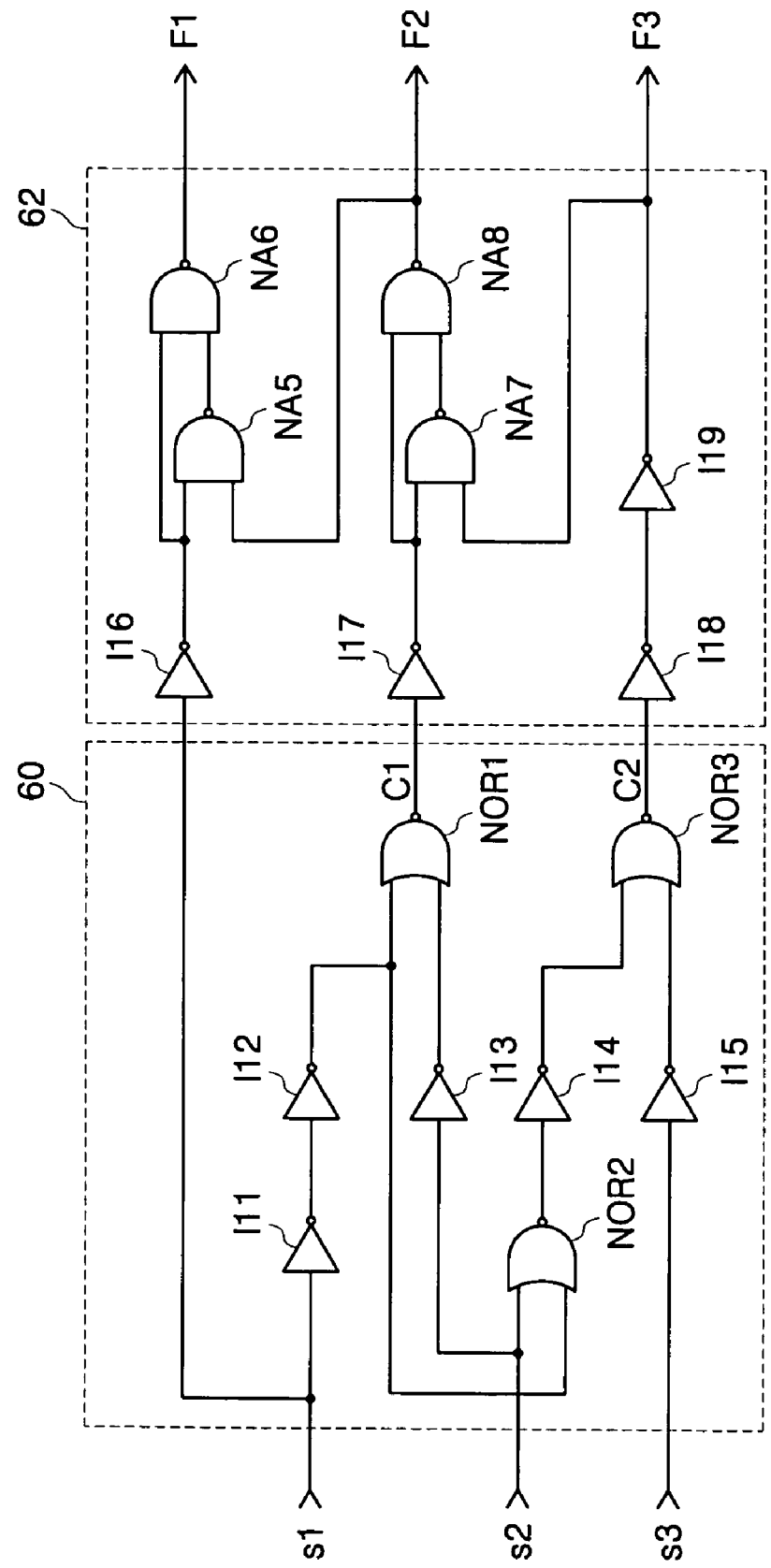
FIG. 7 is a circuit diagram illustrating a control signal generating circuit according to some embodiments of the present invention.

FIG. 7 is a circuit diagram illustrating embodiments of the control signal generating circuit of FIG. 6. The control signal generating circuit of FIG. 7 includes a signal confirming portion 60 and a signal detecting portion 62. The signal confirming portion 60 includes inverters I11 to I15 and NOR gates NOR1 to NOR3. The signal detecting portion 62 includes inverters I16 to I19 and NAND gates NA5 to NA8.

Operations of the embodiments of a control signal generating circuit illustrated in FIG. 7 will now be described. The inverters I11 to I13 and the NOR gate NOR1 detect if the high frequency detecting signal s1 has a logic "low" level and generate an intermediate frequency confirming signal c1 of a logic "high" level when the intermediate frequency detecting signal s2 has a logic "high" level. The NOR gates NOR2 and NOR3 and the inverters I14 and I15 detect if the high frequency and intermediate frequency detecting signals s1 and s2 have a logic "low" level and generate a low frequency confirming signal c2 of a logic "high" level when the low frequency detecting signal s3 has a logic "high" level.

In other words, the signal confirming portion 60 generates the intermediate frequency and low frequency confirming signals c1 and c2 having a logic "low" level when the high frequency detecting signal s1 has a logic "high" level, generate the intermediate frequency confirming signal c1 of a logic "high" level and the low frequency confirming signal c2 of a logic "low" level when the intermediate frequency detecting signal s2 has a logic "high" level and generates the intermediate frequency confirming signal c1 of a logic "low" level and the low frequency confirming signal c2 of a logic "high" level when the low frequency detecting signal s3 has a logic "high" level.

The inverter I16 and the NAND gates NA5 and NA6 generate a control signal F1 of a logic "high" level responsive to a high frequency detecting signal s1 of a logic "high" level or a high frequency detecting signal s1 of a logic "low" level in combination with a control signal F2 of a logic "high" level. The inverter I17 and the NAND gates NA7 and NA8 generate a control signal F2 of a logic "high" level responsive to an intermediate frequency confirming signal c1 of a logic "high" level or an intermediate frequency confirming signal c1 of a logic "low" level in combination with a control signal F3 of a logic "high" level. The inverters I18 and I19 generate a control signal F3 of a logic "high" level responsive to a low frequency confirming signal c2 of a logic "high" level.

In other words, the signal detecting portion 62 generates a control signal F1 of a logic "high" level and control signals F2 and F3 of a logic "low" level in response to the high frequency detecting signal s1 of a logic "high" level and the intermediate frequency and low frequency confirming signals c1 and c2 of a logic "low" level, generates control signals F1 and F2 of a logic "high" level and a control signal F3 of a logic "low" level in response to the high frequency detecting signal s1 and the low frequency confirming signal c2 having a logic "low" level and the intermediate frequency confirming signal c1 having a logic "high" level and generates control signals F1 to F3 of a logic "high" level responsive to the high frequency detecting signal s1 and the intermediate frequency confirming signal c1 having a logic "low" level and the low frequency confirming signal c2 having a logic "high" level.

The control signal generating circuit of the embodiments of FIG. 7 generates control signals F1 to F3, respectively, having a logic "high" level, a logic "low" level and a logic "low" level when the high frequency detecting signal s1 of a logic "high" level is input, generates control signals F1 to F3, respectively, having a logic "high" level, a logic "high" level and a logic "low" level when the intermediate frequency detecting signal s2 of a logic "high" level is input and generates control signals F1 to F3 having a logic "high" level when the low frequency detecting signal s3 of a logic "high" level is input. Accordingly, the control signal generating circuit of various embodiments of the present invention may vary the number of the control signals having a logic "high" level responsive to a corresponding frequency detection signal. The control signal generating circuit in some embodiments of the present invention may be configured to simultaneously set a corresponding control signal and an upper (or lower) control signal to a logic "high" level when the corresponding signal is set to a logic "high" level.

Figure 8A:
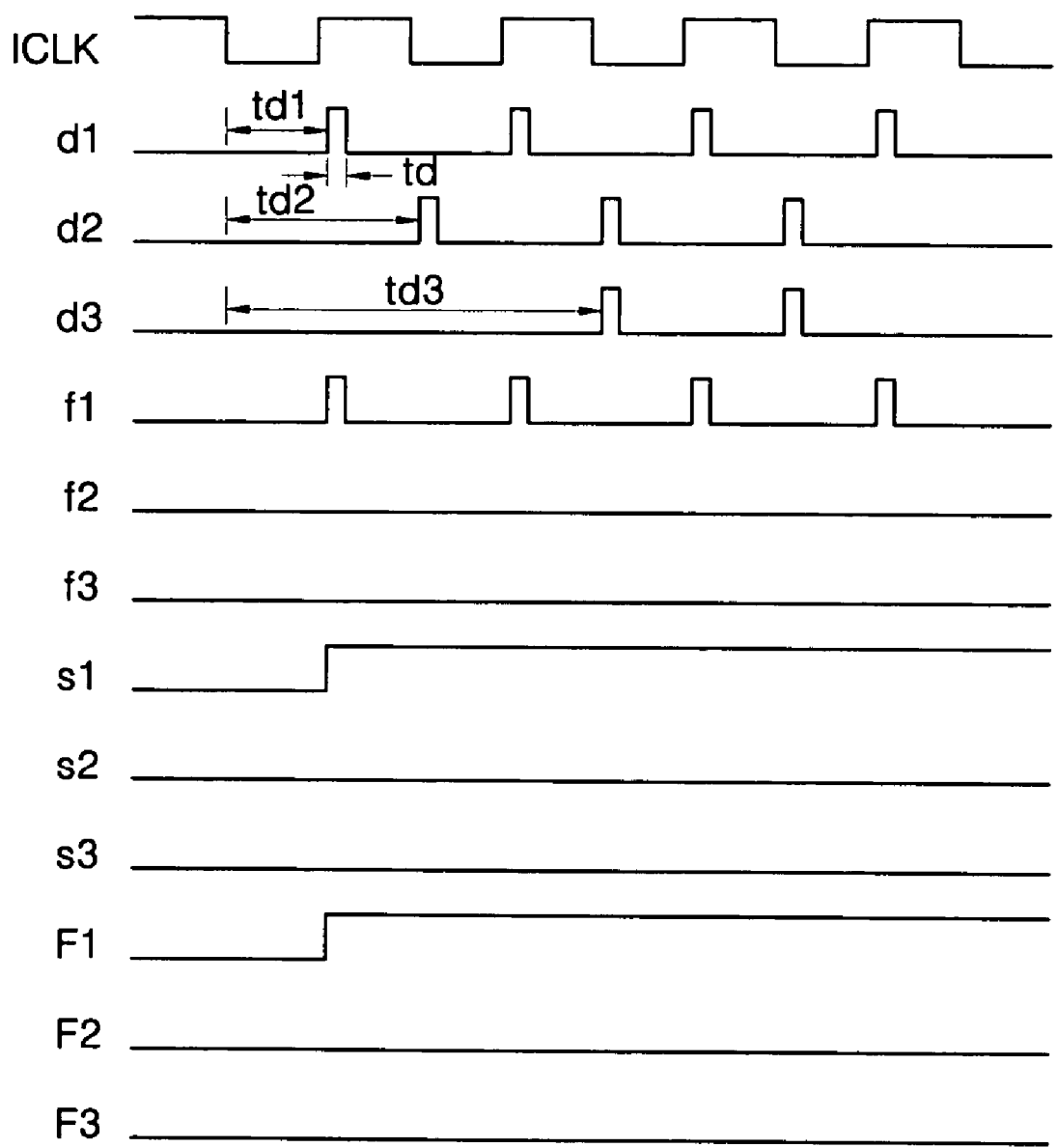
FIGS. 8A to 8C are timing diagrams illustrating operation of the circuits of FIGS. 6 and 7.
Figure 8B:
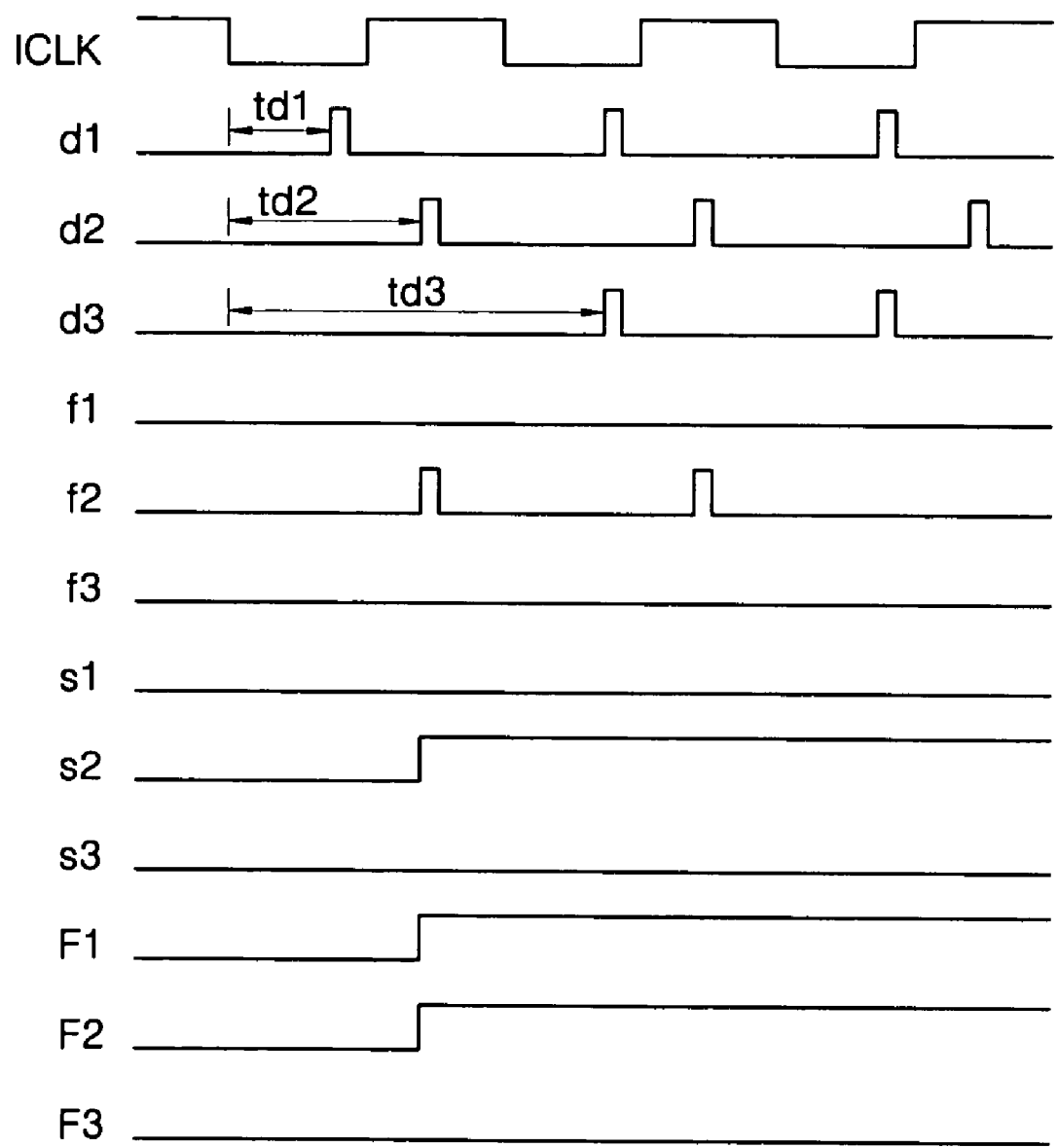
Figure 8C:
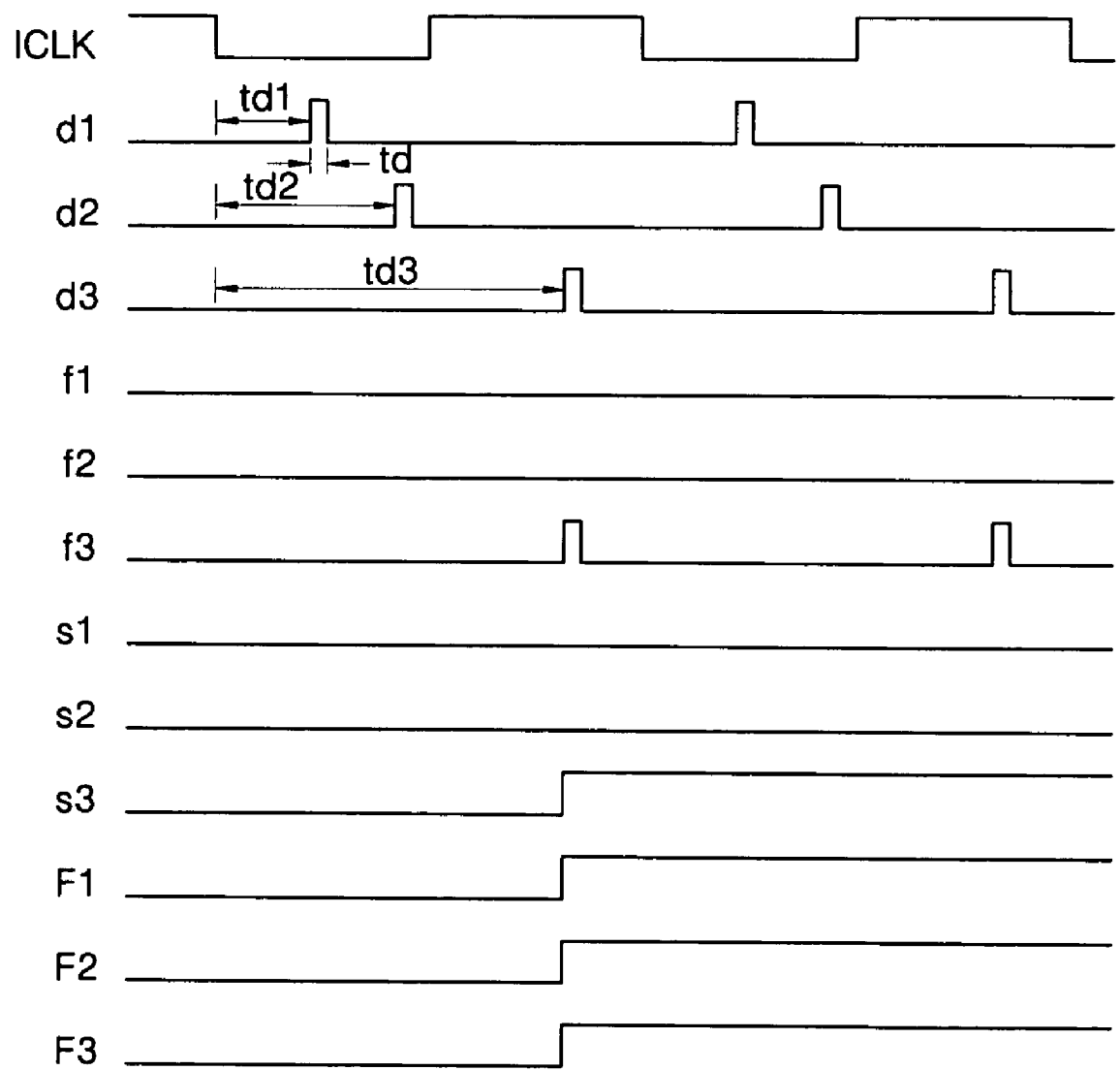

FIG. 8a is a timing diagram illustrating operation of the circuits of FIGS. 6 and 7 responsive to a high frequency input clock signal ICLK. FIG. 8b is a timing diagram illustrating operation of the circuits of FIGS. 6 and 7 responsive to an intermediate frequency input clock signal ICLK. FIG. 8c is a timing diagram illustrating operation of the circuits of FIGS. 6 and 7 responsive to a low frequency input clock signal ICLK.

As shown in FIGS. 8a to 8c, the pulse generators PG1 to PG3 detect a falling edge of the input clock signal ICLK to generate the pulse signals d1 to d3, which are respectively delayed by the delay times td1 to td3 and have a pulse width of a time td. When the input clock signal ICLK is of a high frequency as shown in FIG. 8a, the first detecting signal f1 is generated in response to the pulse signal d1 and the input clock signal ICLK having a logic "high" level. The second and third detecting signals f2 and f3 maintain a logic "low" level. The latch L1 latches the first detecting signal f1 of a logic "high" level and then generates the high frequency detecting signal s1 having a logic "high" level and continues maintain (latches) the high frequency detecting signal s1 at a logic "high" level while the second and third detecting signals f2 and f3 maintain a logic "low" level. The control signal F1 is set to a logic "high" level responsive to the high frequency detecting signal s1 being set to a logic "high" level while the control signals F2 and F3 maintain a logic "low" level.

As seen in FIG. 8b for an intermediate frequency the input clock signal ICLK, the second detecting signal f2 is generated in response to the pulse signal d2 and the input clock signal ICLK having a logic "high" level. The intermediate frequency detecting signal s2 is set to a logic "high" level responsive to the generated second detecting signal f2 and the control signals F1 and F2 are set to a logic "high" level responsive to the intermediate frequency detecting signal s2 having a logic "high" level. The control signal F3 maintains a logic "low" level.

As seen in FIG. 8c for a low frequency input clock signal ICLK, the third detecting signal f3 is generated in response to the pulse signal d3 and the input clock signal ICLK having a logic "high" level. The low frequency detecting signal s3 is set to a logic "high" level responsive to the generated third detecting signal f3. The control signals F1 to F3 are set to a logic "high" level responsive to the low frequency detecting signal s3 having a logic "high" level.

The duty cycle corrector was described above with reference to FIGS. 6–8C as being configured to detect clock signals of 3 different frequencies to generate 3 control signals, however, it may be configured to detect clock signals of n different frequencies to generate n control signals in other embodiments of the present invention where n may be greater or less than 3.

The duty cycle correcting circuit of the present invention in some embodiments may stably correct a duty cycle of a clock by reducing a gain and, thus, reducing a duty cycle correcting range, when a high frequency clock signal is input and by increasing the gain to increase a duty cycle correcting range when a low frequency clock signal is input. As such, a duty cycle correcting circuit and method according to some embodiments of the present invention varies a gain thereof based on a frequency of an input clock signal, which may more stably correct a duty cycle over a wide range of clock signal frequencies.

What is claimed is:

1. A duty cycle correcting circuit, comprising:
    a frequency detecting means for detecting a frequency of an input clock signal to generate a control signal;
    a duty cycle detecting means for detecting a duty cycle of an output clock signal to generate first and second duty cycle detecting signals; and
    a duty cycle correcting means for adjusting a gain in response to the control signal and generating a corrected clock signal in response to the first and second duty cycle detecting signals,
    wherein the input signal comprises an input clock signal and the output signal comprises the corrected clock signal,
    wherein the duty cycle correcting means comprises: a gain adjusting circuit that adjusts the gain of the duty cycle correcting means; and
    an output circuit that outputs the corrected output signal based on the input signal and the adjusted gain.

2. The duty cycle correcting circuit of claim 1 wherein the control signal comprises a predetermined number of signals.

3. The duty cycle correcting circuit of claim 2 wherein the duty cycle correcting means reduces the gain responsive to the control signal when a frequency of the input clock signal is increased.

4. The duty cycle correcting circuit of claim 3 wherein the output circuit includes:
    a main amplifying portion that amplifies a voltage difference between the input clock signal and an inverted input clock signal; and
    the gain adjusting circuit includes:
    a sub amplifying portion that adjusts a gain responsive to the control signal and amplifies a voltage difference between the first and second duty cycle detecting signal; and
    wherein a common output signal of the main and sub amplifying portion is generated as the corrected clock signal.

5. The duty cycle correcting circuit of claim 2 wherein the frequency detecting means includes:
    a pulse generating circuit that detects a frequency of the input clock signal and generates a detecting signal based on the detected frequency of the input clock signal;
    a latch circuit that latches the detecting signal from the pulse generating portion to provide a frequency detecting signal; and
    a control signal generating circuit that generates the control signals responsive to the frequency detecting signal.

6. The duty cycle correcting circuit of claim 5 wherein the control signal generating circuit sets at least one of the control signals to a logic "high" level responsive to the frequency detecting signal from the latch circuit.

7. The duty cycle correcting circuit of claim 5 wherein the control signal generating circuit includes:
    a signal confirming portion that generates at least one frequency confirming signal maintained at a logic "high" level responsive to a selected at least one of the frequency detecting signals having a logic "high" level and another of the frequency detecting signals having a logic "low" level; and
    a signal detecting portion that sets a state of an upper frequency or a lower frequency one of the frequency confirming signals to a logic "high" level to generate the control signals when the at least one frequency confirming signal from the signal confirming portion is set to a logic "high" level.

8. The duty cycle correcting circuit of claim 5 wherein the pulse generating circuit includes:
   a pulse generator that delays the input clock signal by a predetermined time period and generates a pulse signal responsive to an edge of the delayed input clock signal; and
   a gate circuit that generates the detecting signal based on the input clock signal and the pulse signal.

9. The duty cycle correcting circuit of claim 8 wherein the detecting signal comprises a plurality of detecting signals, the frequency detecting signal comprises a plurality of frequency detecting signals and wherein the control signal generating circuit sets at least one of the control signals responsive to an edge of a frequency detecting signal.

10. A duty cycle correcting circuit, comprising:
    a frequency detecting means for detecting a frequency of an input clock signal to generate a control signal;
    a duty cycle detecting means for detecting a duty cycle of an output clock signal to generate first and second duty cycle detecting signals; and
    a duty cycle correcting means for adjusting a first delay time in response to the control signal and the first duty cycle detecting signal and detecting an edge of the input clock signal to generate a first pulse signal
    and for adjusting a second delay time in response to the control signal and the second duty cycle detecting signal and detecting an edge of the input clock signal to generate a second pulse signal and
    latching the first and the second pulse signals to generate the corrected clock signal,
    wherein the input signal comprises an input clock signal and the output signal comprises the corrected clock signal.

11. The duty cycle correcting circuit of claim 10 wherein the duty cycle correcting means includes:
    a first pulse signal generating portion that adjusts the first delay time responsive to the control signal and the first duty cycle detecting signal and detects an edge of the input clock signal to generate a first pulse signal;
    a second pulse signal generating portion that adjusts the second delay time responsive to the control signal and the second duty cycle detecting signal and detects an edge of the input clock signal to generate a second pulse signal; and
    a latch portion that combines the first pulse signal and the corrected clock signal to generate an inverted corrected clock signal and combines the second pulse signal and the inverted corrected clock signal to generate the corrected clock signal.

12. The duty cycle correcting circuit of claim 10 wherein the frequency detecting means includes:
    a pulse generating circuit that detects a frequency of the input clock signal and generates a detecting signal based on the detected frequency of the input clock signal;
    a latch circuit that latches the detecting signal from the pulse generating portion to provide a frequency detecting signal; and
    a control signal generating circuit that generates the control signals responsive to the frequency detecting signal.

13. The duty cycle correcting circuit of claim 12 wherein the frequency detecting circuit is configured to detect at least a high frequency and a low frequency and wherein the frequency detecting circuit includes a control signal generating circuit that sets a greater number of the control signals to the active state when a low frequency is detected than when a high frequency is detected.

14. The duty cycle correcting circuit of claim 12 wherein the control signals comprise at least three control signals and wherein the frequency detecting circuit is further configured to detect an intermediate frequency having a frequency between the high frequency and the low frequency and wherein the control signal generating circuit is configured to set a greater number of the control signals to the active state when an intermediate frequency is detected than when a high frequency is detected and a lesser number of the control signals to the active state when an intermediate frequency is detected than when a low frequency is detected and wherein the active state comprises a logic "high" level.

15. A duty cycle correcting method, comprising:
    detecting a frequency of an input signal to generate a corresponding frequency detecting signal
    generating control signals in response to the corresponding frequency detecting signal;
    generating first and second duty detecting signals by detecting a duty cycle of an output signal;
    amplifying a voltage difference between the input signal and an inverted input clock signal which has an inverted phase of the input signal;
    adjusting a gain of a duty cycle correcting circuit in response to the control signals; and
    amplifying a voltage difference between first and second duty cycle detecting signals to generating a corrected clock signal,
    wherein the input signal comprises an input clock signal and wherein the output signal comprises the corrected clock signal.

16. The method of claim 15 wherein correcting a duty cycle includes reducing the gain responsive to the control signal when a frequency of the input clock signal is increased.

17. The method of claim 16 wherein correcting a duty cycle includes:
    amplifying a voltage difference between the input clock signal and an inverted input clock signal to provide an output to a common output signal line; and
    wherein adjusting a gain comprises adjusting a gain responsive to the control signal and amplifying a voltage difference between the first and second duty cycle detecting signal to provide an output to the common output signal line, wherein the common output signal line is the corrected clock signal.

18. The method of claim 15 wherein generating control signals comprises generating control signals such that a state of upper and/or lower frequency detecting signals of the corresponding frequency detecting signal is changed to generate the control signal when a state of the corresponding frequency detecting signal is changed.

19. The method of claim 18 wherein generating control signals includes
    maintaining the corresponding frequency detecting signal at a logic "high" level to provide a corresponding frequency confirming signal when the corresponding frequency detecting signal has a logic "high" level, and an upper and/or lower frequency detecting signal of the corresponding frequency detecting signal has a logic "low" level; and
    changing a state of an upper and/or lower corresponding frequency confirming signal of the corresponding frequency confirming signal to a logic "high" level to generate the control signals when the corresponding frequency confirming signal is changed to a logic "high" level.

20. The method of claim 15 wherein the control signals comprise a predetermined number of signals.

21. The method of claim 20 wherein the detecting a frequency includes
   detecting a frequency of the input clock signal to generate a detecting signal corresponding to the frequency of the input clock signal;
   latching a detecting signal to generate a corresponding frequency detecting signal; and
   generating the control signals responsive to the corresponding frequency detecting signal.

22. The method of claim 21 wherein detecting a frequency of the input clock signal to generate a detecting signal includes:
   delaying the input clock signal by a predetermined time period and detecting an edge of the input clock signal to generate a corresponding pulse signal; and
   combining the input clock signal and the corresponding pulse signal to generate the corresponding detecting signal.

23. A duty cycle correcting method, comprising:
   detecting a frequency of an input signal to generate a corresponding frequency detecting signal;
   generating control signals in response to the corresponding frequency detecting signal;
   generating first and second duty cycle detecting signals by detecting a duty cycle of an output clock signal;
   adjusting a delay time in response to the control signals and the first duty cycle detecting signal and detecting an edge of the input clock signal to generate a first pulse signal;
   adjusting a delay time in response to the control signals and the second duty detecting signal and detecting an edge of an inverted input clock signal which has an inverted phase of the input clock signal to generate a first pulse signal; and
   latching the first and the second pulse signals to generate a corrected clock signal,
   wherein the input signal comprises an input clock signal and wherein the output signal comprises the corrected clock signal.

24. The method of claim 23 wherein detecting a frequency comprises detecting at least a high frequency and a low frequency and wherein detecting a frequency further comprises setting a greater number of the control signals to the active state when a low frequency is detected than when a high frequency is detected.

25. The method of claim 24 wherein the control signals comprise at least three control signals and wherein detecting a frequency further comprises detecting an intermediate frequency having a frequency between the high frequency and the low frequency and wherein detecting a frequency further comprises setting a greater number of the control signals to the active state when an intermediate frequency is detected than when a high frequency is detected and a lesser number of the control signals to the active state when an intermediate frequency is detected than when a low frequency is detected.

* * * * *